(12) United States Patent
Hauke et al.

(10) Patent No.: US 6,411,520 B1
(45) Date of Patent: Jun. 25, 2002

(54) MODULAR EQUIPMENT FRAME AND MODULES

(75) Inventors: Michael T. Hauke; Raymond A. Bryars, both of Nevada City, CA (US)

(73) Assignee: Grass Valley Group, Nevada City, CA (US)

(*) Notice: Subject to any disclaimer, the term of this patent is extended or adjusted under 35 U.S.C. 154(b) by 0 days.

(21) Appl. No.: 09/551,747

(22) Filed: Apr. 18, 2000

(51) Int. Cl.⁷ .................................................. H05K 7/14
(52) U.S. Cl. ...................... 361/796; 361/730; 361/752; 361/797; 361/803; 439/62
(58) Field of Search ................................ 361/728–730, 361/740, 752, 753, 759, 796, 797, 801, 803; 439/61, 62, 74, 413

(56) References Cited

U.S. PATENT DOCUMENTS

| | | | | |
|---|---|---|---|---|
| 4,703,394 A | * | 10/1987 | Petit et al. ................... | 361/790 |
| 4,838,798 A | * | 6/1989 | Evans et al. .................. | 439/61 |
| 5,023,754 A | * | 6/1991 | Aug et al. .................... | 361/800 |
| 5,062,801 A | * | 11/1991 | Roos ............................ | 439/61 |
| 5,808,876 A | * | 9/1998 | Mullenbach et al. ........ | 361/788 |

* cited by examiner

Primary Examiner—Jayprakash N. Gandhi
(74) Attorney, Agent, or Firm—Kenyon & Kenyon

(57) ABSTRACT

A modular frame assembly and modules are provided. The modular frame assembly includes a motherboard, module connectors and an opening in the motherboard for allowing direct connection of first and second modules. The first modules have plugs that extend through the plane of the motherboard, allowing the size of the opening to be minimized. The second modules have a wide external connector portion that allows for high density interconnection on the rear of the frame. Each of the modules may be provided with a plurality of connectors.

19 Claims, 5 Drawing Sheets

MODULAR EQUIPMENT FRAME AND MODULES

BACKGROUND OF THE INVENTION

1. Field of the Invention

The present invention relates to modular equipment in general and more particularly to modular equipment frames and the modules installed therein.

2. Description of Related Art

Modular frames are intended to accept modules that perform a variety of different functions. In the broadcast video market these functions include distribution of audio and video signals, and conversion of audio and video signals between different standards. A modular frame should be able to handle a variety of different signal types as well as the connector/cabling schemes used for the transmission of these signals.

In modular frames available today, there are three main architectures in use, fixed back-plane, mid-plane back-plane, and transition module based architecture. In a fixed back-plane architecture the modular frame has a fixed back-plane through which all connections are made. The modules mate to the frame through connectors mounted on one side of the back-plane, and all external connections (typically BNC connectors) are made through input/output (I/O) connectors mounted on the opposite side of the back-plane. Examples of this frame type are commercially available as Grass Valley Group SMS8000 series, Grass Valley Group—8900 series, and the Leitch—6800 series. Fixed back-plane frames can have extremely high I/O density. Such frames can also be designed to facilitate the servicing of all active components from the front of the frame, and can provide a great deal of interconnect between modules. The major drawback of the fixed back-plane architecture frames is that the interconnect is inflexible. Connector type is predetermined by the design of the frame and may not be appropriate for all signals for all possible module types. Expensive adapters may be required to handle some signal formats.

In a mid-plane architecture approach the modular frame has a fixed mid-plane to which all connections are made. Modules plug into both the front of the frame and the rear of the frame. The rear modules contain connectors for making all external connections. Such an architecture does not offer as high of an I/O density as the fixed back-plane approach. Due to the ability to customize the connectors on the rear modules, however, it does provide for a wider range of I/O formats then the fixed back-plane approach. Since all I/O must pass through the mid-plane, signal integrity is compromised for high bandwidth signals. This problem can be solved by using active circuitry on the rear module to buffer the signal, but results in compromising serviceability of the system. An example of a modular frame with a mid-plane architecture is available commercially as the Leitch DigiBus® system.

In a transition module architecture the modular frame has a small motherboard. Each module consists of two pieces. A passive rear adapter that carries all of the connectors for external I/O and a front module that has all of the active circuitry for the module. The rear adapter mates to the motherboard from which it picks up power. The front module couples with a connector mounted on the rear adapter. An example of a modular frame with transition module architecture is available commercially as the Grass Valley Max 9000 series. This architecture allows for very flexible I/O, supporting HDTV and most other signaling formats. It also allows easy servicing of all active components from the front of the frame. However, prior implementations of this architecture do not provide for extensive interconnect between modules, and the I/O density is limited.

SUMMARY OF THE INVENTION

The present invention is directed to a modular equipment frame and modules tailored for the broadcast video market. The frame architecture maximizes connector I/O density on the rear of the frame, supports a wide range of I/O formats, provides a great deal of high speed signal interconnection between modules and allows for quick and easy servicing of all active components from the front of the frame. The frame of the present invention comprises a support structure, a motherboard having a transmission portion having a first face, and a second face. There are a first plurality of module connectors coupled to at least one of the first face and the second face. The motherboard defines a plurality of openings that extend through the motherboard from the first face to the second face. There is preferably a second plurality of module connectors coupled to the other of the first face and the second face opposite. The connectors are preferably coupled through a common connection on the transmission portion of the motherboard.

A first module of the present invention includes a body portion, an extension coupled with a first end of the body portion, a plug coupled to the extension, and an electrical connector coupled to the first end of the body portion adjacent the extension. A second module of the invention includes a body portion, an extension coupled with a first end of the body portion, an electrical connector coupled to the extension, a socket coupled to the first end of the body portion adjacent the extension, and an external connection portion coupled with the body portion and dimensioned wider than the body portion.

DETAILED DESCRIPTION

Figure 1:
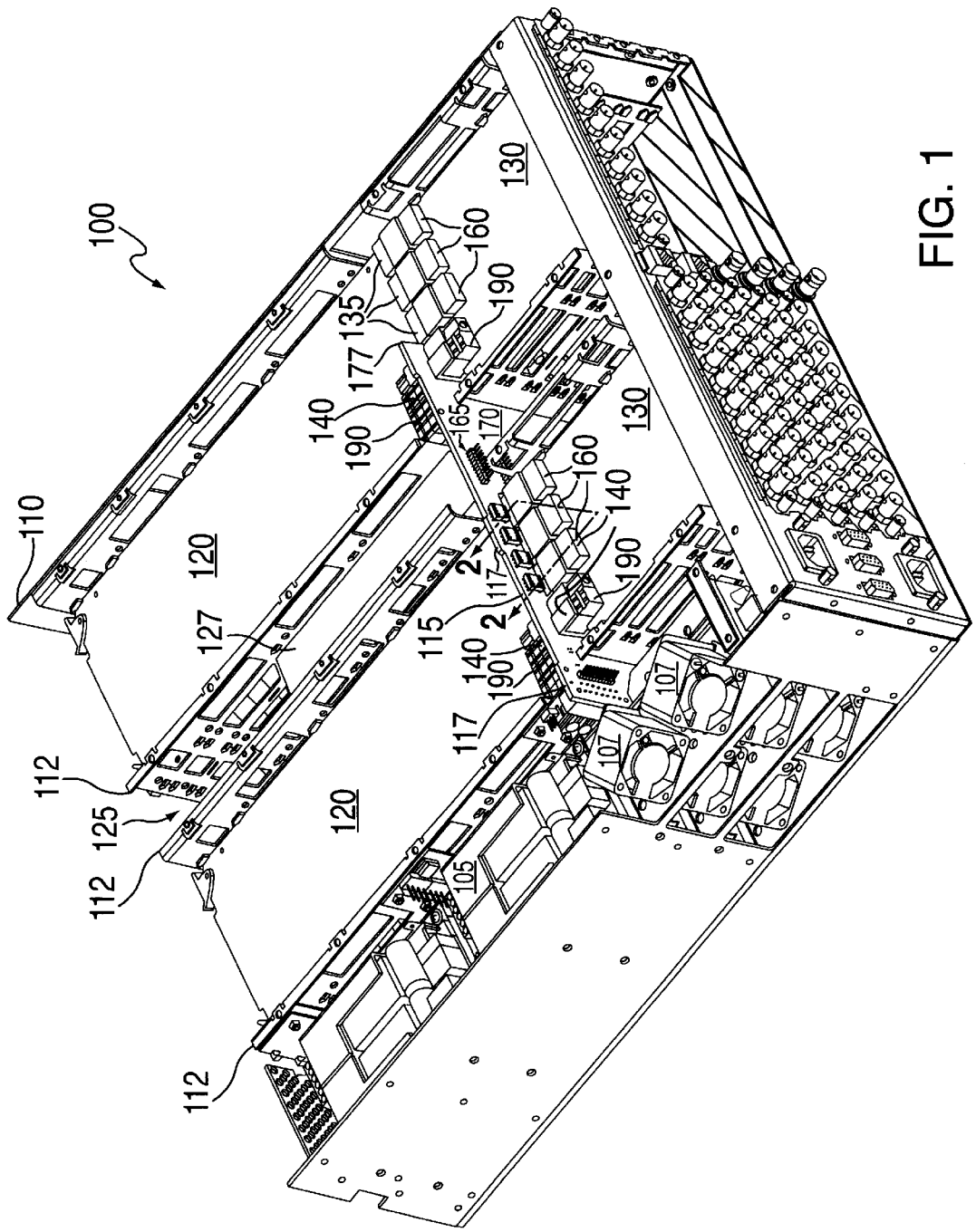
FIG. 1 is a perspective view of the frame and module assembly according to the present invention.

The present invention relates to modular equipment frames and the modules installed therein. FIG. 1 is a perspective view of the modular equipment frame and modules of the present invention. Note that for illustrative purposes the figure depicts a frame capable of maintaining up to twelve modules on each side of the motherboard. The frame 100 of the present invention may be constructed in various sizes and configurations to accommodate fewer or more modules as dictated by the needs of the specific system. The modular equipment frame 100 comprises a support structure 110, and a motherboard 115 having a transmission portion 170. The transmission portion 170 provides for connection areas on the motherboard for distributing power and common signals, and for communication between different module locations. The transmission portion 170 has a first face 172 and a second face 174. The frame assembly also includes a power supply 105 for supplying power to the motherboard and a fan 107 for cooling the system. The motherboard 115 may be provided with tabs 117 for securely fastening the motherboard 115 to the support structure.

There is a module connector 140 coupled to at least one of the first face 172 and the second face 174 of the transmission portion 170 of the motherboard 115. There is preferably at least one module connector 140 coupled on each side of the motherboard 115. It is possible for the motherboard 115 to accommodate a first plurality of module connectors 140 on the first face 172 and a second plurality of module connectors 140 on the second face 174. In order to efficiently organize the modules 120,130 that are to be mounted in, or otherwise coupled to, the frame 100, the module connectors 140 are placed in a vertical configuration along the motherboard 115, either spaced apart or stacked upon one another. The module connectors 140 are preferably coupled to the motherboard 115 opposite one another and are connected to a common passthrough connector or group of connectors (not shown) on transmission portion 170. The module connectors 140 are preferably substantially C-shaped in configuration, but may be any shape that is effective to perform its desired function. The module connectors 140 are capable of providing power, control information, binary data, and other forms of data to the modules 120, 130 from the motherboard 115. Power flows from the power supplies through the motherboard 115 to the connectors 140 and ultimately to first modules 120. It is also possible for power to flow to second module 130. The module connectors 140 also allow the transfer of information between modules 120, 130.

Figure 3:
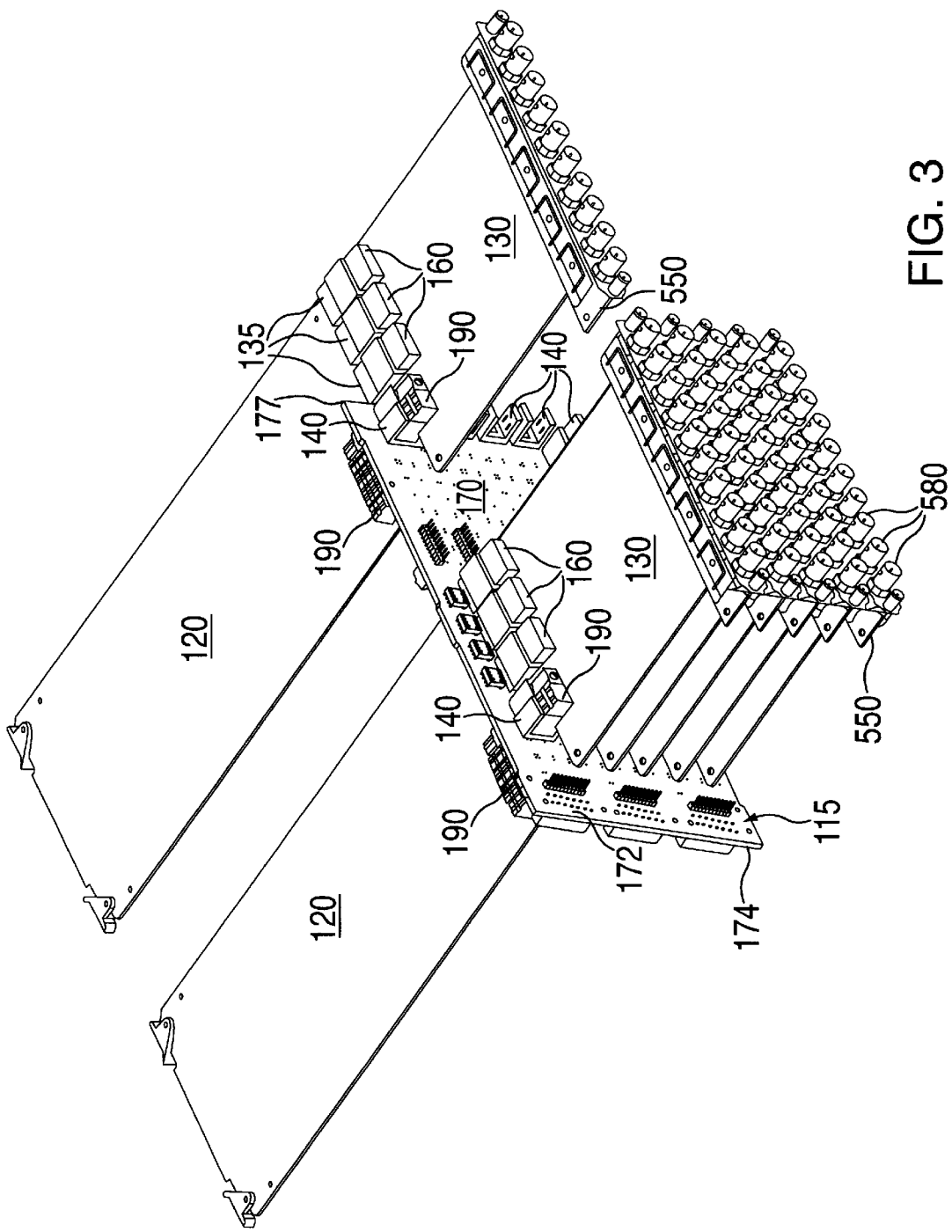
FIG. 3 is a perspective view of a portion of the frame and module assembly according to the present invention.

The motherboard 115 defines an opening 150 that extends through the motherboard 115 from the first face 172 to the second face 174. This opening 150 allows direct connection between modules 120,130 while still maintaining a great deal of inter-module connectivity through the motherboard 115. There are as many openings 150 as the maximum number of sets of module connectors 140. An opening 150 is situated adjacent each set of module connectors 140 for reasons which will be explained below. There are also module connectors 140 coupled to the transmission portion 170 adjacent a first end 177 of the motherboard. There must be space left between the motherboard 115 and the support structure 110 to allow for insertion of the modules 120, 130 at this location as best seen in FIG. 3. The lowermost opening in the motherboard 115 may be provided as a recession or cut-out (not shown) in a bottom edge of the motherboard 115.

The modular equipment frame 100 described is configured to receive modules 120, 130 that are slidably engageable therewith. The modules 120, 130 slidably engage support rails 112 to ensure the modules are properly inserted. The support rails 112 are provided with flanges (not shown) on which each individual module 120, 130 rests. The entire frame 100 is configured to be installed in a conventional rack system.

Figure 4:
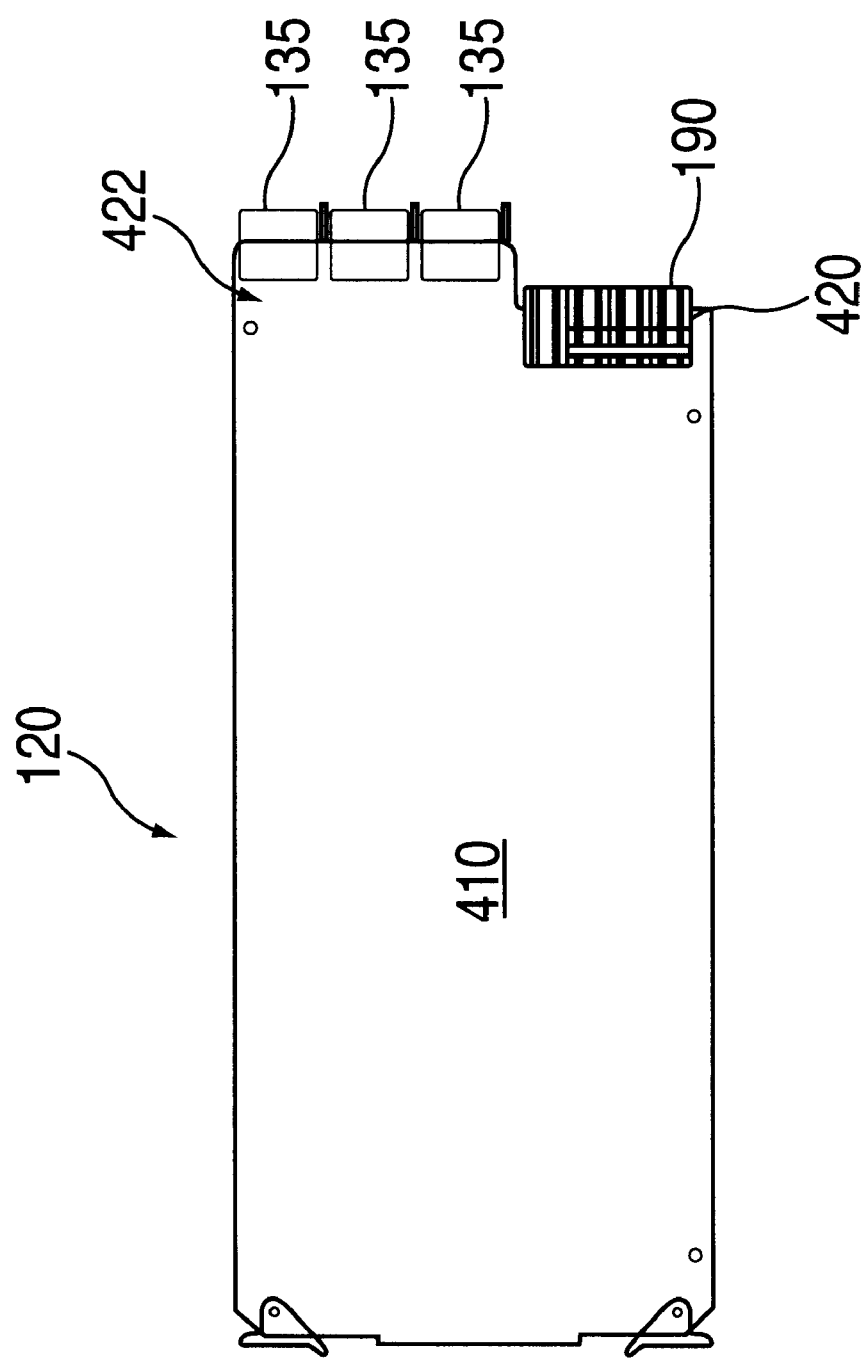
FIG. 4 is an embodiment of a module according to the present invention.

Referring to FIG. 4, a first module 120 engageable with the frame 100 includes a body portion 410, and an extension 422 coupled with a first end 420 of the body portion 410. The extension 422 may be integrally formed with or removably coupled with body portion 410. There is at least one plug 135 coupled to the extension 422. The plugs 135 are elongated and offset from the body portion 410 and are dimensioned such that they extend past a vertical plane of the motherboard 115 when fully installed. The plugs 135 are able to pass through the opening 150 defined in the motherboard 115 as well as extend past the motherboard 115 when the module 120 is coupled to the module connector 140 adjacent the first end 177 of the motherboard 115. Note that it may also be possible for the extension 422 to extend through the opening 150. Such a situation is desirable in a configuration where the plugs 135 are situated on extension 422 such that extension 422 must pass through the opening for plugs 135 to be effective. The plugs 135 are configured to cooperate with sockets 160 provided on the opposing module 130 to be coupled to the frame 100. There are one or more electrical connectors 190 coupled to the first end 420 of the body portion 410 within an indentation defined by the extension 422. The electrical connectors 190 are configured to couple with the module connectors 140 on the motherboard 115. One or more electrical connectors 190 receive power from the motherboard 115 via the module connectors 140 and transmit it to the module 120. The electrical connectors 190 also serve as a conduit for the input and output of information to and from the transmission portion 170 of the motherboard 115, and possibly to the module 130 in the corresponding position on the other side of the motherboard 115.

Figure 2:
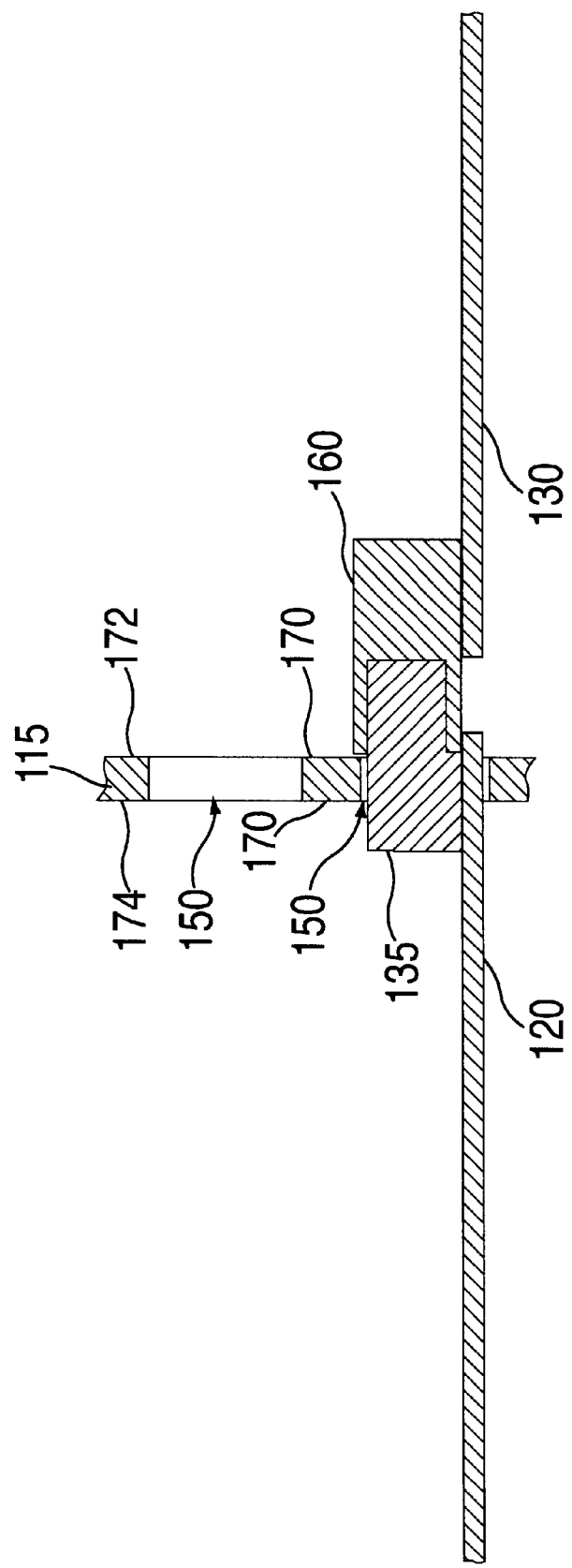
FIG. 2 is a partial cross-sectional view of the frame and module assembly illustrated in FIG. 1.
Figure 5:
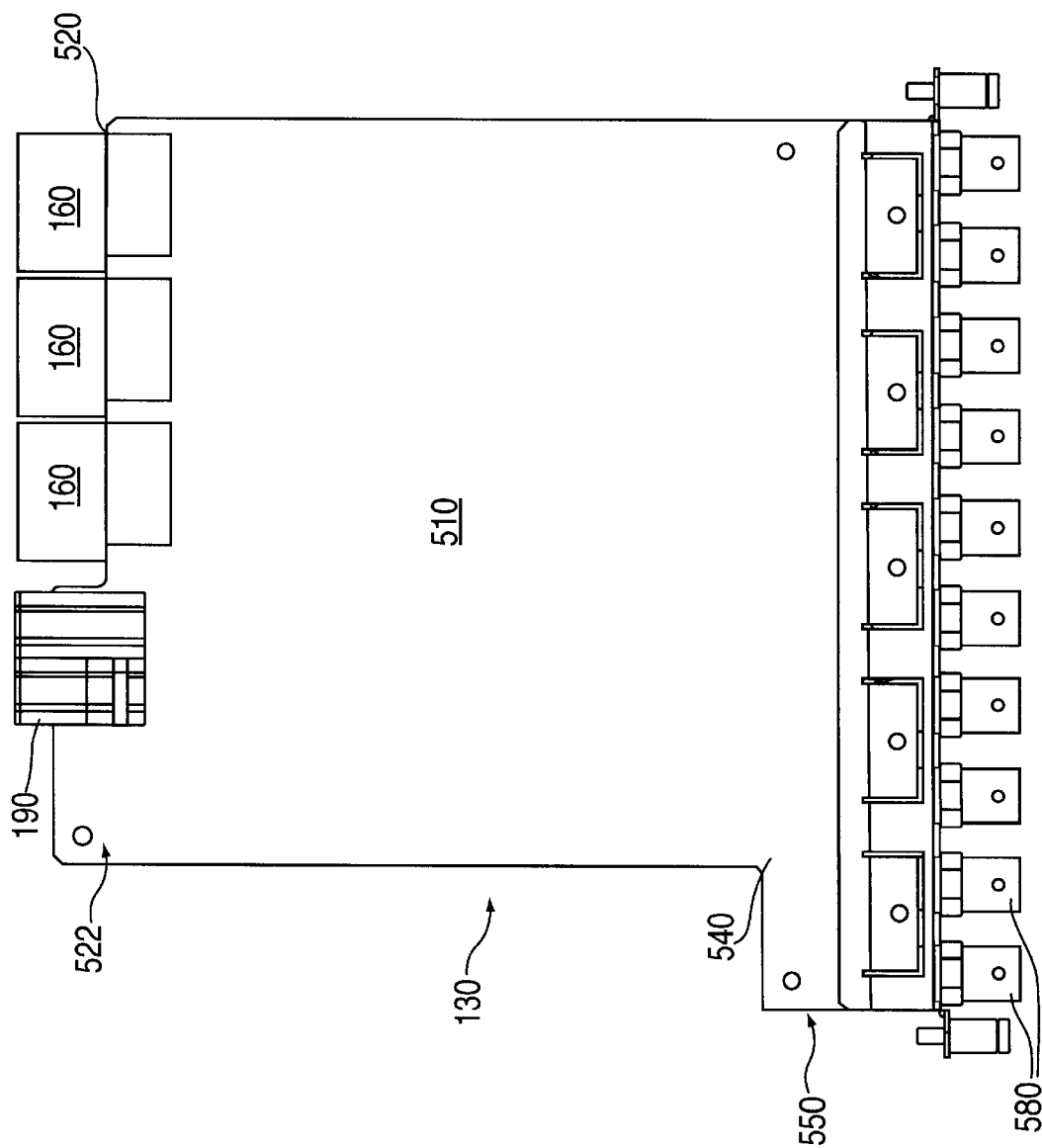
FIG. 5 is an alternative embodiment of a module according to the present invention.

Referring to FIG. 5, a second module 130 engageable with the frame 100 includes a body portion 510, and an extension 522 coupled with a first end 520 of the body portion 510. Extension 522 may be integrally formed with or removably coupled with body portion 510. There are one or more electrical connectors 190 coupled to the extension 522 of the second module 130. There is at least one socket 160 coupled to the first end 520 of the body portion 510 within an indentation defined by the extension 522. The sockets 160 are dimensioned such that they are positioned entirely on one side of the motherboard 115 and do not intersect the vertical plane of the motherboard 115 when filly installed. The sockets 160 are configured to cooperate with the plugs 135 provided on the first module 120. When the sockets and plugs are coupled, an electrical connection is formed. The fact that the larger sockets 160 remain positioned on one side of the motherboard 115 and do not extend past the vertical plane of the motherboard 115 allows the opening 150 in the motherboard 115 to be minimized. The interconnection of the sockets 160 and plugs 135 is best seen in FIG. 2. The opening 150 need only be large enough to allow the smaller plugs 135 to pass through. The motherboard 115 could be configured to allow the sockets 160 to pass through, but such a configuration would limit the useful surface area of the motherboard 115. The electrical connectors 190 are configured to couple with the module connectors 140 on the motherboard 115 as described above. One or more electrical connectors 190 receive power from the motherboard 115 via the module connectors 140 and transmit it to the module 130. The electrical connectors 190 also serves as a conduit for the input and output of information to and from the transmission portion 170 of the motherboard 115, and possibly to the module 120 in the corresponding position on the other side of the motherboard 115. The second module 130 also includes an external connection 550 portion that is coupled with the body portion 510 and is dimensioned wider than the body portion 510, essentially creating an offset that extends past an edge of the body portion 510. The external connection portion 550 is formed at the opposite end 540 of the body portion 510 from the extension 522. The wide dimension of the external connection portion 550 allows for greater space to provide external I/O connectors that are coupled thereto. The external connectors are selected according to the signal type being handled; for video I/O Bayonet Neil-Concelman (BNC) connectors are preferred. It is preferred that the second modules 130 are dimensioned wider then the first modules 120 to allow for high density interconnect on the second side of the frame 100 while still allowing for servicing of power supplies 105, fans 107 and communication modules from the opposite side of the frame 100.

A modular system according to the present invention includes the modular equipment frame 100 described above with first modules 120 and second modules 130 coupled thereto. The system illustrated in FIG. 3 includes a motherboard 115 capable of accommodating six modules 120, 130 on each side of the motherboard 115. This architecture can be extended to larger frames by increasing the size of the motherboard 115 to accommodate additional modules.

The modular system of the present invention comprises a modular equipment frame 100 having a support structure 110, and a motherboard 115 having a transmission portion 170 with a first face 172, and a second face 174. There is a first plurality of module connectors 140 coupled to one of the first face 172 and the second face 174. As described above, the motherboard 115 defines a plurality of openings 150 extending through the motherboard 115 from the first face 172 to the second face 174. A second plurality of module connectors 140 is coupled to the other of the first face 172 and the second face 174.

There are a plurality of first modules 120 slidably and removably engageable with the modular equipment frame 100, each of the modules 120 having a body portion 410, an extension 422 coupled with a first end 420 of the body portion 410, and at least one of plugs 135 coupled to the extension 422. The extension 422 may be integrally formed with or removably coupled with body portion 410. The plugs 135, as described above, extend past a vertical plane of the motherboard 115. There is one or more first electrical connector 190 coupled to the first end 422 of the body portion 410 adjacent the extension 422. The first electrical connectors 190 are configured to cooperate with the first module connectors 140.

There are also a plurality of second modules 130 engageable with the modular equipment frame 110 and with the first module 120. Each second module 130 has a body portion 510, an extension 522 coupled with a first end 520 of the body portion 510. The extension 522 may be integrally formed with or removably coupled with body portion 510. There are one or more second electrical connectors 190 coupled to the extension 522. The second electrical connector 190 is configured to cooperate with the second module connectors 140. There are one or more sockets 160 coupled to the first end 520 of the body portion 510 adjacent the extension 522 and configured to cooperate with the plugs 135 of the first module 120. The sockets 160 are positioned only on one side of said motherboard 115 and do not intersect the vertical plane of the motherboard 115. There is an external connection portion 550 integrally formed with the body portion 510 that is dimensioned wider than said body portion 510 as described above.

In the system of the present invention, it is preferred that the modules 120, 130 are aligned such that the body portions 410, 510, which have the same width, are co-linear. Because the external connection portion 550 is dimensioned wider than the body portions 410, 510, a gap 125 is defined between adjacent first modules 120 and between the body portion 510 of adjacent rear modules. The gap 125 is wide enough to allow for the insertion of other modules 127 such as network cards or similar modules. There are preferably pin connectors 165 or other similar connectors provided on either face 172, 174 of the motherboard 115 within the gap 125 to allow for connection of the other modules.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A modular equipment frame, comprising:

a support structure;

a motherboard coupled to said support structure having a transmission portion having a first face, and a second face each of which to interface with a plurality of coplanar modules;

a first module connector coupled to one of the first face and the second face; and said motherboard defining a plurality of openings extending through said motherboard from the first face to the second face.

2. The modular equipment frame of claim 1, further comprising:

a second module connector coupled to the other of the first face and the second face.

3. The modular equipment frame of claim 2, wherein said first module connector and said second module connector are electrically coupled to common connector of said transmission portion.

4. A modular equipment frame, comprising:

a support structure;

a motherboard coupled to said support structure having a transmission portion having a first face, and a second face each of which to interface with a plurality of coplanar modules; and a first plurality of module connectors coupled to one of the first face and the second face; and said motherboard defining a plurality of openings extending through said motherboard from the first face to the second face.

5. The modular equipment frame of claim 4, further comprising:

a second plurality of module connectors coupled to the other of the first face and the second face.

6. The modular equipment frame of claim 5, wherein said first and plurality of module connectors are each arranged in a vertical configuration.

7. The modular equipment frame of claim 5, wherein one of said first plurality of module connectors is coupled to said transmission portion adjacent a first side of the opening on one of the first and second face; and one of said second plurality of module connectors is coupled to said transmission portion adjacent a first side of the opening on the other of the first and second face.

8. The modular equipment frame of claim 7, wherein one of said first plurality of module connectors is coupled to said transmission portion adjacent a first end of the motherboard on one of the first and second face; and one of said second plurality of module connectors is coupled to said transmission portion adjacent the first end of the mother board on the other of the first and second face.

9. The modular equipment frame of claim 8, wherein each of said plurality of first module connectors and each of said plurality of second module connectors opposite each other are electrically coupled to common connector on said transmission portion.

10. A module engageable with a modular equipment frame, comprising:

a body portion;

an extension integrally formed with a first end of said body portion;

a plug coupled to said extension;

an electrical connector coupled to said first end of said body portion adjacent said extension.

11. A module engageable with a modular equipment frame, comprising:

a body portion;

an extension coupled with a first end of said body portion;

an electrical connector coupled to said extension;

a socket coupled to said first end of said body portion adjacent said extension;

an external connection portion coupled with said body portion and dimensioned wider than said body portion.

12. The module of claim 11, further comprising:

an external connector coupled to said external connection portion.

13. A modular system comprising:
   a modular equipment frame;
   a first module engageable with said module equipment frame and coplanar with other modules having
      a body portion; and
      a first connector portion extending past a vertical plane of said modular equipment frame;
   a second module engageable with said modular equipment frame, on a side opposite said first module and coplanar with other modules, having
      a body portion; and
      a second connector portion configured to cooperate with said first connector portion; said second connector portion positioned entirely on one side of the vertical plane of said modular equipment frame.

14. The modular system of claim 13, wherein said first connector portion extends through an opening defined in said modular equipment frame.

15. The modular system of claim 13, wherein said first connector portion extends past said modular equipment frame adjacent a first side of said modular equipment frame.

16. A modular system comprising:
   a modular equipment frame having
      a motherboard having a transmission portion having a first face, and a second face; and
      a first module connector coupled to at least one of the firs face and the second face, said motherboard defining an opening extending through said motherboard form the first face to the second face;
      a second module connector coupled to the other of the first face and the second face;
   a first module engageable with said modular equipment frame and coplanar with other modules having
      A body portion;
      An extension coupled with a first end of said body portion;
      A plug coupled to said extension, said plug extending past a vertical plane of said motherboard;
      A first electrical connector coupled to said first end of said body portion adjacent said extension, said first electrical connector configured to cooperate with said first module connector;
   A second module engageable with said modular equipment frame and said first module coplanar with other modules, having
      A body portion;
      An extension coupled with a first end of said body portion;
      A second electrical connector coupled to said extension, said second electrical connector configured to cooperate with said second module connector;
      A socket coupled to said first end of said body portion adjacent said extension and configured to cooperate with said plug of said first module, said socket positioned on one side said motherboard;
      A external connection portion coupled with said body portion and dimensioned wider than said body portion.

17. A modular system comprising:
   a modular equipment frame having
      A motherboard having a transmission portion having a first face, and a second face; and
      a first plurality of module connectors coupled to one of the first face and the second face, said motherboard defining a plurality of openings extending through said motherboard from the first face to the second face;
      a second plurality of module connectors coupled to the other of the first face and the second face;
   a plurality of first modules engageable with said modular equipment frame and coplanar with other modules, each said module having
      a body portion;
      an extension coupled with a first end of said body portion;
      a plurality of plugs coupled to said extension, said plugs extending past a vertical plane of said motherboard;
      a first electrical connector coupled to said first end of said body portion adjacent said extension, said first electrical connector configured to cooperate with said first module connector;
   a plurality of second modules coplanar with other modules engageable with said modular equipment frame and said first module, each said second module having
      a body portion;
      an extension coupled with a first end of said body portion;
      a second electrical connector coupled to said extension, said second electrical connector configured to cooperate with said second module connector;
      a plurality of sockets coupled to said first end of said body portion adjacent said extension and configured to cooperate with said plugs of said first module, said sockets positioned on one side of said motherboard;
      an external connection portion coupled with said body portion and dimensioned wider than said body portion.

18. The modular system of claim 17, wherein said plurality of plugs of at least one of said first modules extends through said opening in said motherboard.

19. The modular system of claim 17, wherein at least one of said first plurality of module connectors and one of said second plurality of module connectors are adjacent a first side of said motherboard;
   said first electrical connector is coupled to said first module connector and said second electrical connector is coupled to said second module connector such that said plurality of plugs is coupled to said plurality of sockets adjacent the first side of said motherboard.

* * * * *